United States Patent [19]

Rabinzohn

[11] Patent Number: 5,378,309
[45] Date of Patent: Jan. 3, 1995

[54] METHOD FOR CONTROLLING THE ETCHING PROFILE OF A LAYER OF AN INTEGRATED CIRCUIT

[75] Inventor: Patrick D. Rabinzohn, Pont-Saint-Martin, France

[73] Assignee: Matra MHS, Nantes, France

[21] Appl. No.: 924,943

[22] Filed: Aug. 5, 1992

[30] Foreign Application Priority Data

Aug. 5, 1991 [FR] France ............................ 91 09951

[51] Int. Cl.⁶ .......................................... H01L 21/306
[52] U.S. Cl. ................................ 156/643; 437/229; 437/187; 437/225; 156/664; 156/665
[58] Field of Search ................ 156/643, 664, 665; 437/229, 187, 225, 228

[56] References Cited

U.S. PATENT DOCUMENTS 4,436,584  3/1984  Bernacki et al. ............... 156/643
4,678,540  7/1987  Uchimura ....................... 156/643

FOREIGN PATENT DOCUMENTS 0147322  7/1985  European Pat. Off. .
2137143  10/1984  United Kingdom .

OTHER PUBLICATIONS

S. Wolf, Silicon Processing for the VLSI Era, vol. 1, Lattice Press, Sunset Beach Calif., 1986, pp. 551–555.
Oda et al., "Undercutting Phenomena in Al Plasma Etching", Japanese Journal of Applied Physics, vol. 19, No. 7, Jul. 1980 pp. 405–408.
Proceedings of the 3rd Int., IEEE VLSI Multilevel Interconnection Conf., 9–10 Jun. 1986, Santa Clara, Calif., USA, pp. 198–204; Abraham: "Sidewall Tapering of Plasma Etched . . . ".
Japanese Journal of Applied Physics, Part 2, vol. 28, No. 6. Tokyo Japan, Jun. 1989, pp. L1070–L1072, Ohno et al., "Reactive Ion Etching of Copper Films in SiCl4 and N2 . . . ".
Proceedings of the SPIE, vol. 923, Electron–Beam, X-Ray and Ion-Beam Technology, . . . 2–4 Mars 1988, Santa Clara, Calif., US, pp. 55–62, Zwicker et al., "Fabrication . . . :".
Journal of the Electrochemical Society, vol. 137, No. 6, Jun. 1990, Manchester, N.H., USA, pp. 1907–1911; KUO: "Factors affecting the Molybdenum line slope by . . . ".

Primary Examiner—Brian E. Hearn
Assistant Examiner—Trung Dang
Attorney, Agent, or Firm—Larson and Taylor

[57] ABSTRACT

The invention concerns a process for slope etching a layer of an integrated circuit. The layer to be etched is coated with a masking photoresist layer. The process consists of jointly performing a passivation of the etching flank of the layer to be etched and a nonisotropic erosion of the masking photoresist layer, which makes it possible to control the slope of the etching flank of the layer to be etched.

7 Claims, 4 Drawing Sheets

ISOTROPIC ETCHING OF THE PHOTORESIST

ANISOTROPIC ETCHING OF THE PHOTORESIST

ANISOTROPIC EROSION OF THE PHOTORESIST
AND PASSIVATION OR THE ETCHING FLANK

FIG. 1c *(PRIOR ART)*

METHOD FOR CONTROLLING THE ETCHING PROFILE OF A LAYER OF AN INTEGRATED CIRCUIT

BACKGROUND AND SUMMARY OF THE INVENTION

The present invention relates to a process (method) for controlling the etching profile of a layer of an integrated circuit.

Besides the dimensional control of the etching of the layers of integrated circuits, the control of the etching profiles, that is to say of the spatial law of etching in a direction at right angles to the surface of the substrate of the integrated circuit, is involved in an increasingly sensitive manner in the development of etching techniques in microelectronics.

Following the advent of dry etching, or plasma etching, the control of the profile of the interconnection holes made in the dielectric for isolation between semiconductor or conductor levels was the first problem encountered. In such a case the solution consists in employing anisotropic etching, that is to say comprising only one component at right angles to the surface of the substrate; in particular of the dielectric layer such as SiO2. The control of the slope is obtained by usage or erosion of the photoresist mask.

As shown in FIG. 1a) in relation to a first embodiment of the prior art, this erosion can be isotropic, such an erosion nevertheless exhibiting the disadvantage of an excessively high sensitivity to the effects of charge, that is to say high sensitivity to the surface to be etched, to the distance between patterns and to the size of the patterns. As shown in FIG. 1b, this erosion can also be anisotropic. However, such an erosion makes it necessary for the photoresist mask to be profiled, that is to say to have its profile adapted prior to the actual etching process. The adaptation techniques employed for this purpose in most cases include a heat treatment, such as flow, and turn out to be unsuitable for the production of micron- and, even more so, submicron-sized patterns.

Insofar as the control of the etching profile of the interconnecting materials is concerned, this control has hitherto been essentially limited to that of the anisotropy of etching, that is to say to the control of the vertical character of this profile, that is at right angles to the surface. As shown in FIG. 1c, anisotropic etching of a metal, such as aluminum, requires the passivation of the etching flank, that is to say the formation of a thin layer inhibiting the risk of side attack by the etching agent which, in this particular case, consists of atomic chlorine originating from the Cl2 molecule. Such a passivation is in most cases obtained by formation and deposition of low-volatility chloro- or fluorocarbon compounds $CCl_x$ or $CF_x$, originating from the use of the masking photoresist and/or from the cracking of additional gases such as $CCl_4$, $CHCl_3$, $CF_4$, $CHF_3$, $SiCl_4$ or $NF_3$. This mechanism inhibits etching by eliminating any side etching effect on the flanks of the metal. Thus, an anisotropic aluminum etching process which can be employed for the manufacture of integrated circuits, that is to say in which the erosion of the photoresist mask remains compatible with the topography of these circuits, can be used after an appropriate choice of the parameters of the ion etching plasma, such as pressure of the gaseous atmosphere, radio-frequency power, gas flow rate, gas mixture. This choice depends, furthermore, on the design of the reactive ion etching reactor.

Beyond simple anisotropic etching, the control of the slope of the profile of the interconnecting metallic materials offers the technological advantage of making it possible to improve the planarising power and the quality of the deposits of the upper layers such as the intermetallic dielectric or encapsulation layers, whatever the technique of dielectric deposition which is employed, resulting in better behaviour and better reliability of the electronic chips in the medium or long term.

However, the control of the etching profile of a metallic material,such as aluminum, by anisotropic erosion of the masking photoresist, according to FIG. 1b, or by deposition of polymers on the etching flanks while reinforcing the deposit-passivation effect of FIG. 1c, offers a solution which is difficult to implement industrially. In fact, such a result can be obtained only at the cost of an excessively high erosion of the masking photoresist or of a chemical etching environment which is excessively polymerizing and therefore generating particles and, as a result, defects in the definition of the metal level.

The subject of the present invention is the use of a process for controlling the etching profile of a layer, especially a metallic layer, of an integrated circuit, which does not present the abovementioned disadvantages.

Another subject of the present invention is the use of a process for controlling the etching profile of a layer, especially a metallic layer, of an integrated circuit, permitting the use of chemical reactions and products which are not, or are only slightly, polymerizing, and this makes it possible to avoid the appearance of defects in the definition of the level of the layer, especially the metallic layer.

Another subject of the present invention is the use of a process for controlling the etching profile of a layer, especially of a metal layer, of an integrated circuit, permitting an etching process giving rise to a low vertical erosion, i.e. in a direction at right angles to the surface of the substrate of the integrated circuit, of the masking photoresist, this erosion being, according to another objective of the process forming the subject of the invention, made minimal, in order to adapt the process forming the subject of the invention to the conditions of industrial utilisation.

The process for slope etching of the profile of a layer of an integrated circuit, called a layer to be etched, this layer being coated with a layer of masking photoresist, in accordance with the subject of the present invention, is noteworthy in that it consists in performing jointly a passivation of the etching flank of the said layer to be etched and a nonisotropic erosion of the said masking photoresist layer, and this makes it possible to control the slope of the etching flank of the layer to be etched.

The process forming the subject of the invention finds application in the industry for the manufacture of integrated circuits on an industrial scale.

BRIEF DESCRIPTION OF THE DRAWING

It will be understood better on reading the description and on inspection of the drawings hereinafter, in which, besides FIGS. 1a, 1b, 1c, which relate to the prior art.

DETAILED DESCRIPTION

The process for slope etching of a layer of an integrated circuit which forms the subject of the present invention will be described first of all in connection with FIG. 2a.

In general, the process forming the subject of the present invention consists in carrying out the sloping etching of an integrated circuit layer by the conjunction of a passivation of the etching flank and of a nonisotropic erosion of the masking photoresist layer over the layer called layer to be etched of the abovementioned integrated circuit.

Figure 1A:
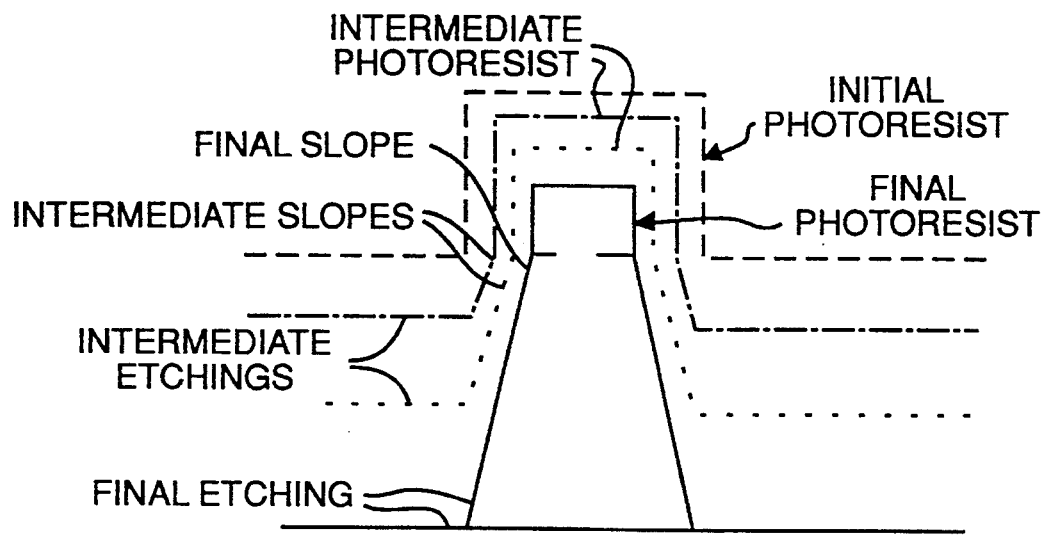
Figure 1B:
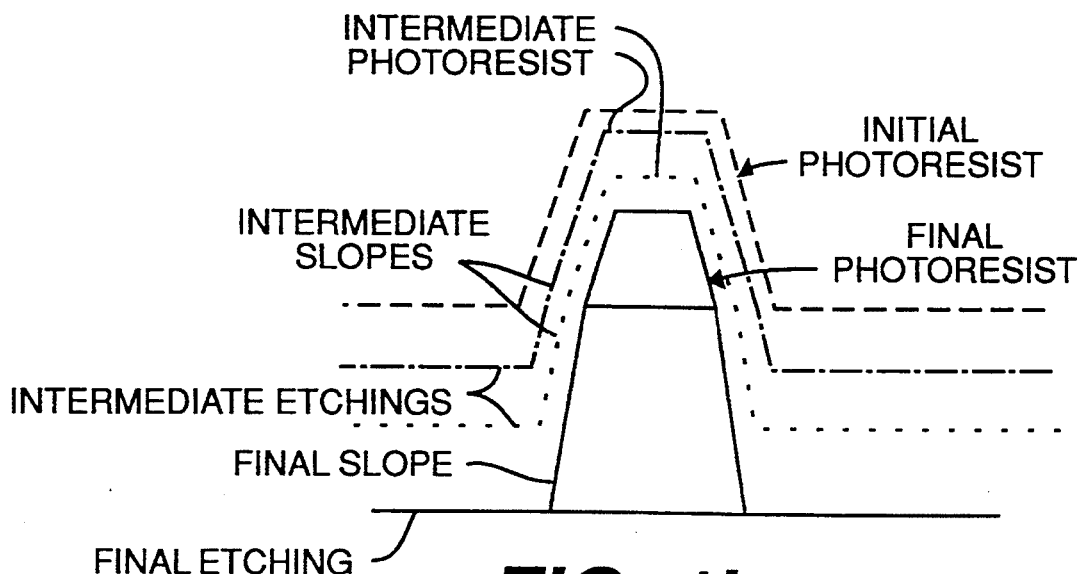
Figure 2A:
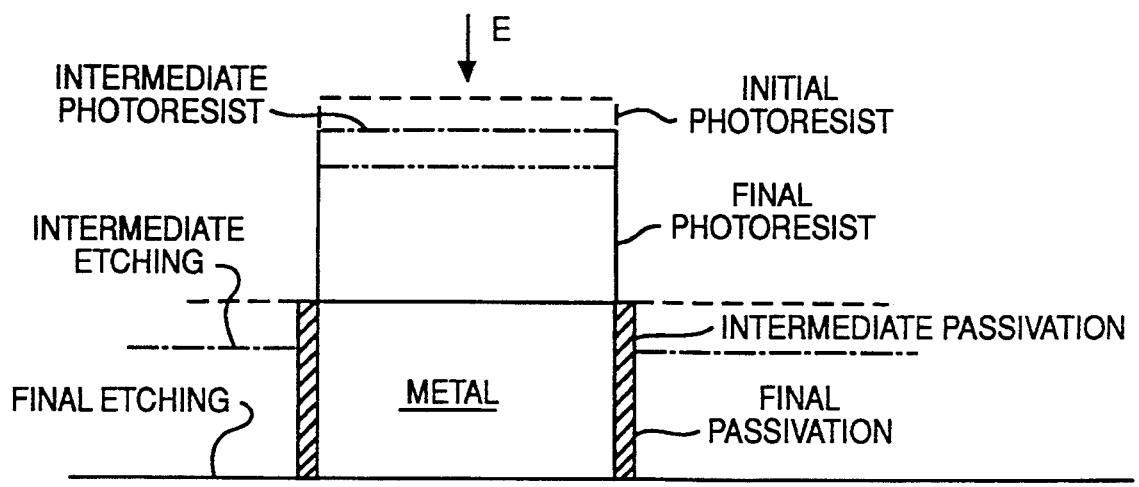
FIG. 2a shows illustratively an embodiment of the process forming the subject of the present invention.
Figure 2A:
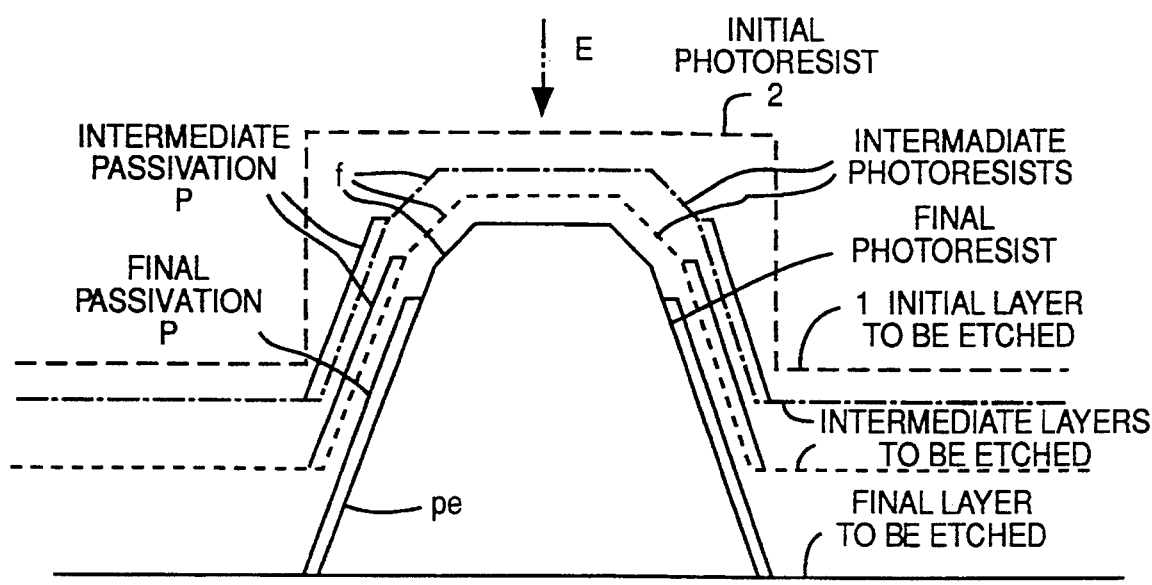

In FIG. 2a the layer to be etched carries the reference 1 and is coated with a photoresist layer 2 making a mask along two dimensions contained in a plane at right angles to the plane of the sheet or section plane of FIG. 2a.

According to a particularly advantageous characteristic of the process forming the subject of the invention, this process consists in performing jointly a passivation, marked P, of the etching flank of the layer to be etched 1 and a nonisotropic erosion of the masking photoresist layer 2, the joint carrying out of the abovementioned two operations making it possible to control the slope, marked pe, of the etching flank of the layer to be etched 1.

In general, it will be understood that the control of the abovementioned slope pe of the etching flank of layer 1 is obtained for a low erosion in the vertical direction of the masking photoresist layer 2 and by the use, in order to carry out the nonisotropic erosion of the abovementioned photoresist layer, of a reactive ion etching process for example, in an etching medium of very low polymerizing effect, that is in the absence of deposition of chloro- or fluorocarbon compounds.

According to a first operating method such as shown in FIG. 2a, the process forming the subject of the present invention consists, with a view to performing the control of the slope of the etching flank of the layer to be etched 1, in performing a profiling of the photoresist layer 2 at the foot of the flank of the latter. Without any limitation being implied, the foot of the flank is defined as the side region of the masking photoresist layer which is situated in the vicinity of the layer to be etched 1, this side region, as shown in section in FIG. 2a, perpendicular to the surface of the layer to be etched 1 at the beginning of the use of the process forming the subject of the present invention, becoming, little by little as the process proceeds, inclined at a slope pe because of the nonisotropic erosion of the abovementioned masking photoresist layer 2.

Furthermore, in accordance with the abovementioned operating method, it thus consists in simultaneously performing the transfer of the profiling of the photoresist layer 2 into the region of the layer to be etched 1 by anisotropic etching, symbolised by the electrical field E accelerating an ionic etching flux, of the photoresist layer 2. The profiled photoresist layer 2 at the foot of the flank thereof is thus subjected to the nonisotropic erosion because of the conjunction of the anisotropic etching produced by ion etching and of the conjoint deposition of a low-volatility compound on the foot of the flank of the abovementioned photoresist layer. The conjunction of the two phenomena thus produces, on the one hand, the profiling of the photoresist layer 2 at the foot of the flank of the latter, and the transfer into the region of the layer to be etched 1 of the nonisotropic erosion, that is to say of the anisotropic etching through the intermediacy of the reactive ionic etching E and of the passivation of the etching flank of the layer to be etched 1. The slope pe formed initially in the region of the photoresist layer 2 is thus transferred to the region of the etching flank of the layer to be etched 1.

In general, it will be considered that, in order to ensure the anisotropic character of the reactive ion etching, the latter is performed at low pressure, that is to say at a surrounding gas pressure which is lower than 200 mtorr.

Furthermore, the anisotropic character of the reactive ion etching is ensured by a dilution of the reactive ion etching atmosphere, it being possible for this atmosphere to consist of a chlorine compound diluted in a neutral gas such as nitrogen or argon. It will be noted that the use of such a reactive ion etching atmosphere makes it possible to introduce a purely physical etching effect, that is to say one caused merely by the acceleration of the ions by the electrical field E shown in FIG. 2a, for example.

Insofar as the component of deposition forming the passivation P of the etching flank of the layer to be etched 1 is concerned, and before the profiling of the photoresist layer 2 at the foot of the flank of the latter, such a component of deposition can then be advantageously obtained by the addition to the abovementioned etching atmosphere of a low-volatility gas which does not directly produce any carbon compound. Such a gas may, for example, consist of chlorosilane $SiCl_4$.

According to another operating method which is also shown in FIG. 2a, the control of the slope pe of the etching flank of the layer to be etched 1 can advantageously be carried out by simultaneous production of a faceting of the photoresist layer 2 at the top of the flank thereof, by virtue of the abovementioned anisotropic etching process.

It will be noted that such a faceting operation makes it possible, during the nonisotropic erosion stage, concurrently to produce a higher local erosion of the photoresist layer 2 in the region of the ridges of the faceting patterns and the formation of carbon compounds which redeposit at the foot of the pattern and of the layer to be etched 2, and this makes it possible to perform the control of the slope pe or etching profile of the layer to be etched 1.

Figure 2B:
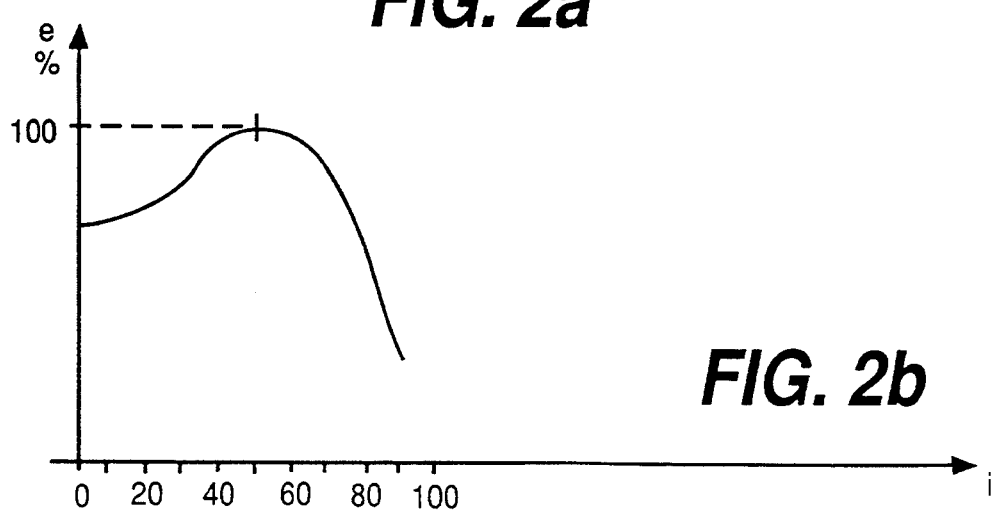
FIG. 2b shows a diagram of the efficiency e, as a percentage of an erosion by reactive ionic etching as a function of the angle of incidence i, expressed in degrees, of the ion flux originating from the plasma on an exposed face of the substrate of the integrated circuit, FIGS. 3a)–3d) show various stages of a first embodiment of the process forming the subject of the invention, in which the etching of the masking photoresist is performed for a minimum erosion of the flanks of the masking photoresist, FIGS. 4a)–4d) show various stages of a second embodiment of the process forming the subject of the invention, in which the flanks of the masking photoresist subjected to a profiling are submitted to a more intense erosion, and this in fact makes it possible to ensure a transfer of the profiling of the flanks of the masking photoresist into the region of the flanks of the layer to be etched.

In general, it will be understood that the faceting of the photoresist layer 2 at the top of the flank of the latter is performed at normal incidence to the substrate of the reactive ion plasma symbolized by the arrow E. As shown in FIG. 2b, the abovementioned plasma exhibits a maximum degree of sputtering in the case of an incidence of between 40° and 60° to the normal to the local surface of the substrate or of the masking photoresist 2. In the abovementioned operating method the facets generated by the operation of faceting of the masking photoresist layer 2 are obtained by preferential erosion in the vicinity of the radius of curvature of the ridges of the photoresist layer 2. The abovementioned facets, as shown in FIG. 2a and marked f, thus have an inclination of between 40° and 60° in relation to the direction of incidence of the plasma and thus correspond to the maximum degree of sputtering e as shown in FIG. 2b, as a function of the angle of incidence i.

It will be noted that the phenomenon of faceting arises from the dependence of the degree of sputtering e, due to the physical component of the reactive ion etching, in relation to the angle of incidence of the ions. The maximum degree of sputtering corresponds to an amplification of the erosion of the facets of the masking photoresist layer by a factor of 2 to 10.

In order to make use of the faceting process as described above, the physical component of the etching by reactive ion etching of the photoresist layer forming the mask must be large. Such a situation corresponds to a reduced chemical or reactive component, that is to say to the carrying out of the reactive ionic etching process in a regime of low erosion of masking photoresist layer. Such an etching operation can be carried out at low pressure, that is to say at a pressure of reactive ion etching atmosphere, that is to say lower than 200 mtorr, consisting of a reactive gas such as chlorine, C12, diluted with nitrogen or argon, as described above in connection with the process of transfer of the slope pe of the foot of the flank of the photoresist layer 2.

It will be easily understood that the process for controlling the slope of the etched profile can be accordingly performed by either or both of the processes described above, that is to say through the intermediacy of the one, the process for transfer of the profiling of the photoresist layer into the region of the layer to be etched 1, and/or of the other, that is to say the process for faceting the photoresist layer at the top of the flank of the latter, which were previously described in the description.

It will be understood, in particular, that the process of etching by reactive ionic etching must thus be performed, in either or in both cases, with the aid of a gaseous mixture of the type $N_2$—$Cl_2$, Ar—$Cl_2$, $N_2$—$Cl_2$—$SiCl_4$, Ar—$Cl_2$—$SiCl_4$, $N_2$—$Cl_2$—$SiCl_4$—$BCl_3$ or Ar—$Cl_2$—$SiCl_4$—$BCl_3$, and this makes it possible to control the value of the slope of the profile etched by either or both of the abovementioned processes.

It will be noted that the radio-electric power or radio-frequency power applied to generate the plasma for etching by reactive ionic etching depends, of course, on the etching reactor employed, but must be sufficient to ensure the intrinsic anisotropy which is necessary for the abovementioned mechanisms. It will be noted that, in practice, the required power level remains completely standard.

For a particular embodiment in a layer to be etched 1 consisting of aluminum, the slope pe being from 50° to 90° in relation to the base of the substrate of the integrated circuit, it will be indicated that the rate of attack for aluminum etching should be between 7,000 and 13,000 A/min, whereas the rate of attack of the masking photoresist layer 2 should be between 2,000 and 5,000 A/min.

It will be noted that the control of the slope pe is performed directly by that of the composition of the etching atmosphere, that is to say by the proportions of nitrogen $N_2$ or of argon Ar or of $Cl_2$ and of chlorosilane $SiCl_4$.

A more detailed description of either or both processes for controlling the slope pe of the etching flank of the layer to be etched 1 will be given in connection with FIG. 3 or with FIG. 4.

In general, it will be considered that the process forming the subject of the present invention can be characterised by the fundamental element hereinafter.

In the case of a momentary angle $\alpha$ at the foot of the masking photoresist layer 2, the momentary angle of the etching flank of the layer to be etched 1 is such that the ratio of the tangents of the two angles is proportional to the ratio of the apparent rate of etching of the layer to be etched, marked vcg, that is to say of the nonisotropic etching resulting from the anisotropic etching in the vertical direction due to the reactive ion etching and of the concurrent passivation deposit, and of the rate of etching of the masking photoresist, marked vcr, decreased by a term which is the product of the rate of isotropic deposition of the passivation layer P, this rate being marked D, multiplied by the tangent of the momentary angle $\alpha$ at the foot of the masking photoresist layer.

The abovementioned angles obey the relationship:

$$\tan \theta = \frac{vcg \times \tan \alpha}{vcr - D \times \tan \alpha}$$

A more detailed description of the use of the process for controlling the etching profile of a layer of an integrated circuit forming the subject of the present invention will be given in connection with FIG. 3 in the case where the masking photoresist layer does not comprise any initial preetching process, the flank of the masking photoresist layer being thus substantially at right angles to the initial layer to be etched 1, and with FIG. 4 respectively, in the case where, on the contrary, the masking photoresist layer 2 is subjected to a preetching process, the flank of the masking photoresist layer 2 exhibiting an inclination or slope pe, this flank forming an angle $\alpha$ in relation to the surface of the layer to be etched 1.

Figure 3A:
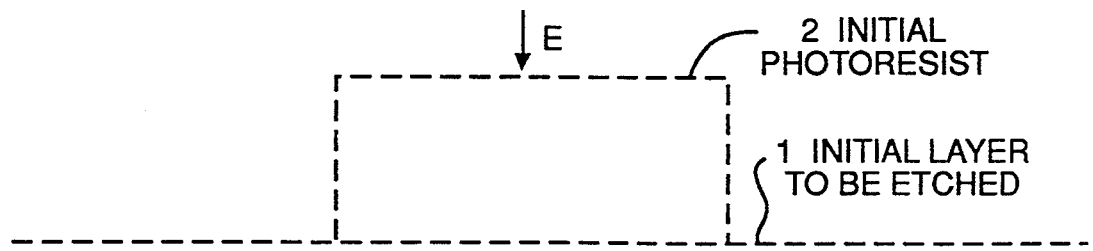

In accordance with FIG. 3a), the initial masking photoresist layer 2 has a flank at right angles to the free surface of the layer to be etched 1, which is assumed to be horizontal. The actual etching process using reactive ion etching, symbolized by the arrow E makes it possible to create the structure shown in FIG. 3b) by employing a nonisotropic erosion of the masking photoresist layer 2, a profiling of this photoresist layer 2 at the foot of the flank of the latter being performed by the creation of a flank of slope pe, this etching flank and the profiling of the photoresist layer 2 being thus transferred into the region of the layer to be etched 1, because of the anisotropic etching E of the photoresist layer 2, as shown in the abovementioned FIG. 3b). It will be noted, of course, that, during this process, the passivation P of the etching flank of the layer to be etched 1 is performed because of the presence of the products of erosion of the masking photoresist layer 2.

Figure 3B:
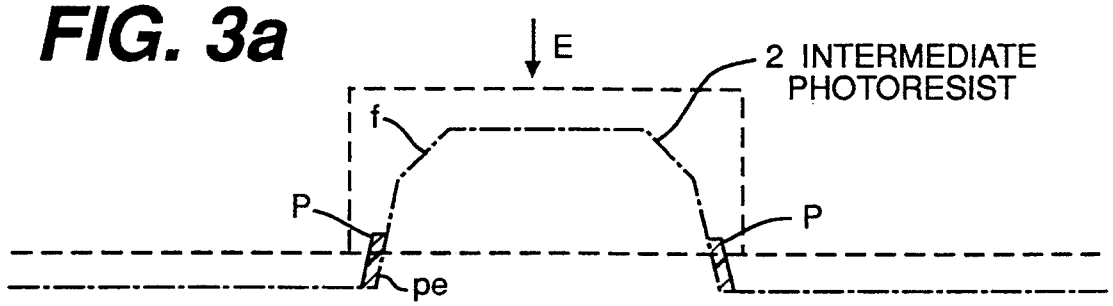
Figure 3C:
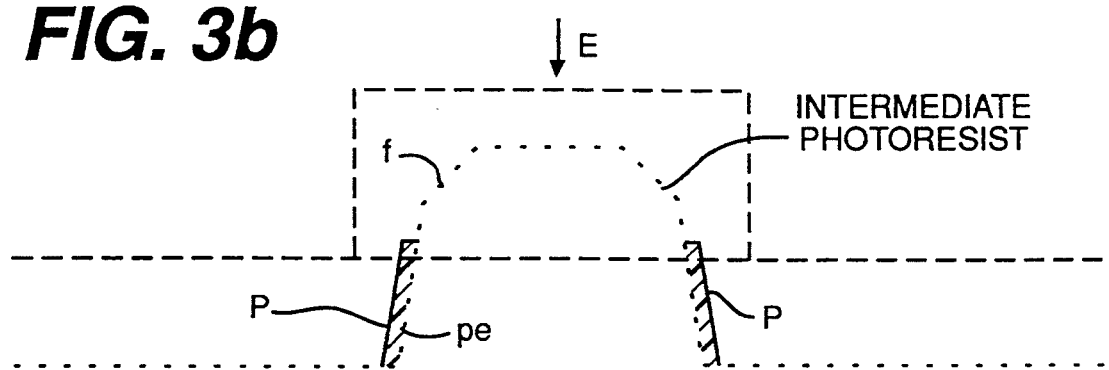

In FIG. 3c), the transfer process is maintained, and this makes it possible to preserve the slope pe of the etching flank of the masking photoresist layer 2 and, of course, of the layer to be etched 1, because of the transfer of the profiling thus obtained.

Figure 3D:
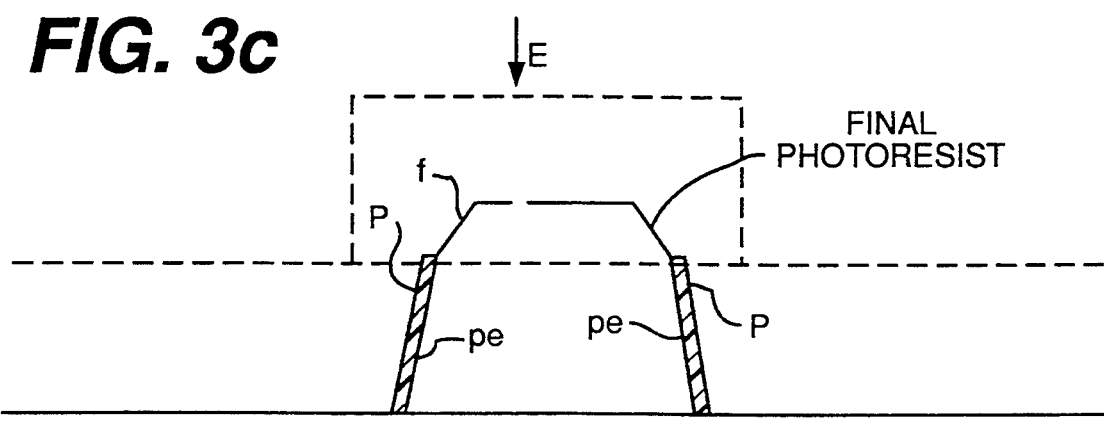

Finally in FIG. 3d), the layer to be etched 1 has been completely reduced, except where the part situated under the final masking photoresist layer 2 is concerned, the slope pe of the abovementioned photoresist layer 2 and of the remaining part of the layer to be etched 1 being, of course, maintained. It will be understood, of course, that the remainder of the final masking photoresist layer 2 and the passivation P present on the etching flanks of the layer to be etched 1 can subsequently be eliminated by any chemical treatment of suitable conventional type.

Finally, it will be noted that during the process as shown in FIG. 3, and in particular FIGS. 3b), c) and d) of the latter, the faceting phenomenon characteristic of the use of the process forming the subject of the present invention has been demonstrated by the materialisation of the facets f at the top of the intermediary or final masking photoresist layer.

Alternatively, in the case of FIG. 4, the initial masking photoresist layer 2, previously to the actual etching process, has been subjected to a preetching stage, the effect of which is to generate etching flanks of slope pe inclined in relation to the free surface of the layer 1 to be etched, assumed to be horizontal, the etching flanks of the initial masking photoresist layer 2 being thus inclined at an angle $\alpha$ in relation to the abovementioned free surface. It will be noted that the preetching process may consist of a mild etching, which has the property of selectively attacking the initial masking photoresist layer 2, excluding an attack alternatively layer 1 to be etched. On the, the initial masking photoresist layer 2 can be deposited and treated so as to exhibit etching flanks which have the slope pe as shown at point a) of FIG. 4.

Figure 4A:
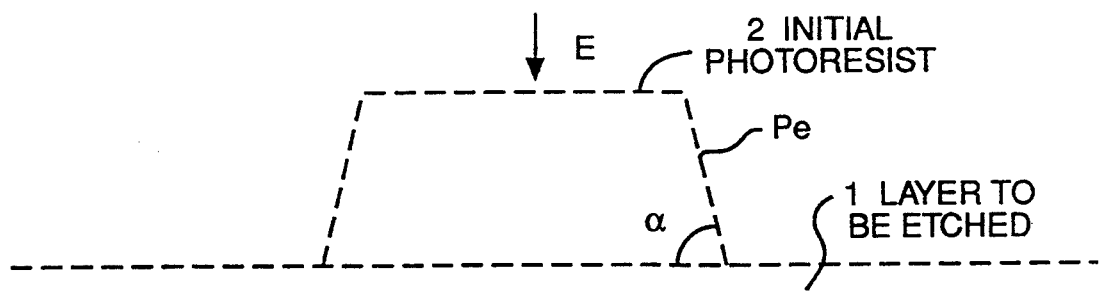
Figure 4B:
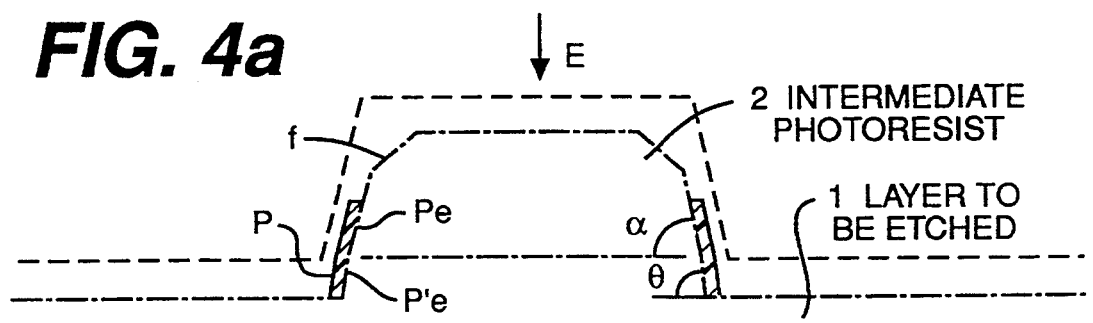
Figure 4C:
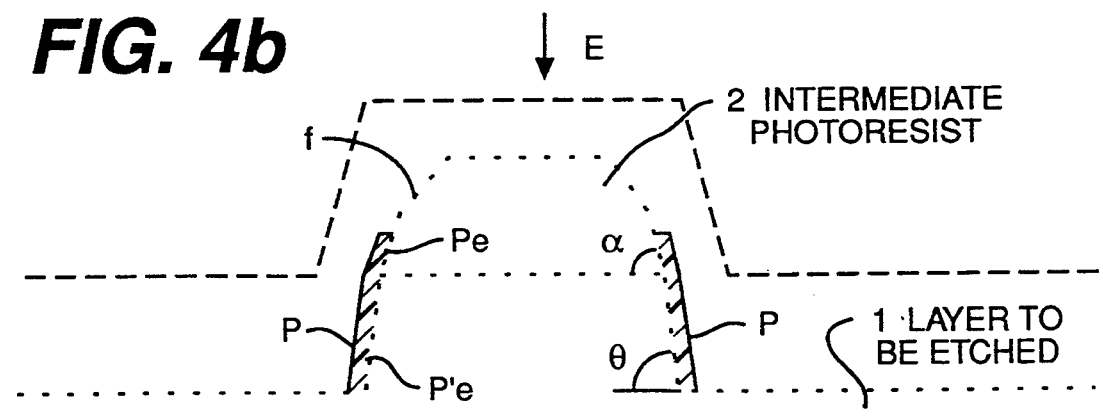

The use of the process forming the subject of the present invention as shown in FIG. 4a) makes it therefore possible, using reactive ionic etching symbolised by the arrow E, to perform, on the one hand, the profiling of the etching flanks of the masking photoresist layer 2, the joint passivation P of the etching flank of the layer to be etched 1, and, finally, the transfer of the profiling of the abovementioned photoresist layer 2 into the region of the layer to be etched 1, in accordance with the relationship referred to above in the description. As shown in FIGS. 4b) and c) especially, the layer to be etched 1 therefore has an etching flank exhibiting an inclination at an angle $\Theta$ in relation to the free surface of the intermediary layer to be etched 1, the angle $\Theta$ obeying the abovementioned relationship and corresponding to an inclination of slope p'e, obtained by transfer of the slope pe of the masking photoresist layer 2. It will be noted, of course, that in the abovementioned relationship the rate of etching of the layer to be etched vcg denotes the apparent or net rate of etching in the vertical direction of etching and of the competitive deposition arising from the erosion of the masking layer 2 and constituting the passivation P of the etching flank of the layer to be etched 1.

It will also be noted that in the abovementioned relationship D denotes the rate of isotropic deposition of the products of erosion of the masking photoresist layer 2, this rate of isotropic deposition being seen only as its horizontal component.

Figure 4D:
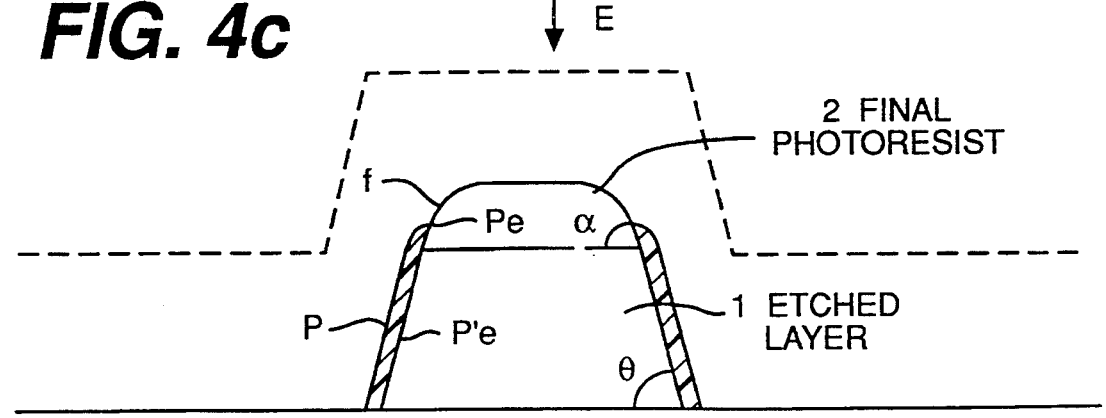

In FIG. 4d) the final etched layer exhibiting the abovementioned angle $\Theta$ has been shown, whereas the masking photoresist layer 2 exhibits, on the contrary, a corresponding angle $\alpha$ in the region of its etching flank.

It will be noted that in all cases, as shown in FIGS. 4b), c) and d), the faceting phenomenon is also obtained, this faceting phenomenon being represented by the marking f at the top of the masking photoresist layer 2.

Examples of use of the process forming the subject of the present invention will now be given in the case of the etching of aluminum and of tungsten, respectively.

Etching of aluminum.
Obtaining a profile of angle $\Theta = 75°$ with:
gas flow rate: 50 sccm $SiCl_4$—40 sccm $Cl_2$—60 sccm $Cl_2$
pressure: 60 mtorr
RF power: 300 W (2.4 watt/cm$^2$).
Obtaining a profile of angle $\Theta = 85°$ with:
gas flow rate: 40 sccm $SiCl_4$—65 sccm $Cl_2$—70 sccm $N_2$
pressure: 110 mtorr
RF power: 350 watts (2.9 W/cm$^2$).

It should be remembered that in the values referred to above sscm denotes the abbreviation for "standard cubic centimeters per minute", that is cm$^3$/min. Furthermore, it should be remembered that, insofar as aluminum is concerned, the rate of attack is between 7,000 and 13,000 A/min, whereas the rate of attack of the masking photoresist layer is between 2,000 and 5,000 A/min.

Etching of tungsten.

It will be noted that insofar as the etching of a layer to be etched made of tungsten, for example, is concerned, in accordance with the process forming the subject of the present invention, such an etching operation can be performed by a reactive ion etching (RIE) method at a pressure below 200 mtorr with the aid of a gas mixture of the type $N_2$—$SF_6$, $N_2$—$NF_3$, Ar—$SF_6$, Ar—$NF_3$, $N_2$—$SF_6$—$Cl_2$, Ar—$SF_6$—$Cl_2$, $N_2$—$NF_3$—$Cl_2$, Ar—$NF_3$—$Cl_2$. The use of the abovementioned gas mixtures under abovementioned pressure conditions makes it possible to control the slope of the etched profile in accordance with one or both of the processes for controlling slope which are described above in the description. It will be noted, of course, that the radio-frequency RF power applied depends on the e'ching reactor, but must be sufficient to ensure the intrinsic anisotropy necessary for the proposed mechanism.

More particularly, insofar as tungsten is concerned, the operating conditions were the following:
rate of attack of tungsten: 2,000 to 10,000 A/min,
rate of attack of the masking photoresist layer : 1,000 to 10,000 A/min,
angle at the foot of the photoresist layer by preetching: : 60° to 90°.

An example of use has made it possible to obtain the following results in the case of tungsten:
obtaining of an etching profile at 75° with:
gas flow rate: 50 sccm $SF_6$—20 sccm $N_2$,
pressure: 150 mtorr
power: RF 250 watts (2 W/cm$^2$).

A process for sloping etching of a layer of an integrated circuit of particularly high performance has thus been described, since the process forming the subject of the present invention makes it possible to perform the sloping etching of layers of integrated circuit material, such as aluminum or tungsten metal layers or even of nonmetallic layers such as polysilicon.

In general, it will be considered that the layers capable of being etched in accordance with the use of the process forming the subject of the present invention are, on the one hand, layers of the aluminum type, it being possible for this material to be additionally doped with materials such as silicon, titanium, copper, siliconcopper and silicon-titanium alloys, it being additionally possible for these layers to include a barrier or bonding sublayer such as layers of titanium, titanium nitride, TiN, of the alloy, TiW, and, on the other hand, interconnecting materials of the tungsten type, which can also include a barrier or bonding sublayer.

What is claimed is:

1. Method for slope etching of a layer of an integrated circuit, said layer being coated with a masking photoresist layer and having an etching flank during etching operation, wherein said method comprises the steps of:
    passivating said etching flank of said layer to be etched;
    nonistotropic eroding, simultaneously with said passivating, said masking photoresist layer, making it possible to control the slope of the etching flank of said layer to be etched, said nonisotropic eroding comprising,
        performing a profiling said photoresist layer at the foot of the flank of said photoresist layer, and
        transferring, simultaneously with said performing, said profiling of said photoresist layer into the region of said layer to be etched by anisotropic etching of said photoresist layer, said profiled photoresist layer thus being subjected to said nonisotropic eroding;
    wherein the ratio of the tangent of an instantaneous angle $\alpha$ of the foot of said masking photoresist layer and the tangent of an instantaneous angle $\Theta$ of said etching flank of said layer to be etched is proportional to the ratio of an apparent rate vcg of etching of said layer to be etched and a rate vcr of etching of said masking photoresist decreased by a term which is the product of a rate D of isotropic deposition of said passivation layer multiplied by the tangent of said instantaneous angle $\alpha$, represented by $$\tan\theta = \frac{vcg \times \tan\alpha}{vcr - D \times \tan\alpha}.$$

2. Method according to claim 1, wherein, in order to control the slope of said etching flank of said layer to be etched, said method comprises simultaneously faceting said photoresist layer at the top of said etching flank of said photoresist layer by anisotropic etching, which makes it possible during said nonisotropic eroding to generate concurrently a greater local usage of said photoresist layer in the region of ridges of patterns formed by said faceting and a formation of carbon compounds which redeposit at the foot of said patterns and of said layer to be etched, which makes it possible to control the slope of said layer to be etched.

3. Method according to claim 1, wherein in order to control the slope of said etching flank of said layer to be etched, said method comprises simultaneously faceting said photoresist layer at the top of said etching flank of said photoresist layer by anisotropic etching, which makes it possible during said nonisotropic eroding to generate concurrently a greater local usage of the photoresist layer in the region of top edges of patterns formed by said faceting and formation of carbon compounds which redeposit at the foot of said patterns and of said layer to be etched, which makes it possible to control the slope of said layer to be etched.

4. Method according to claim 3, wherein said anisotropic etching is performed by reactive ion etching at low pressure.

5. Method according to claim 4, wherein said reactive ion etching is performed in an atmosphere consisting of at least one of a chlorine and fluorine compound diluted in a neutral gas.

6. Method according to claim 4, wherein said faceting of said photoresist layer at the top of the flank of said photoresist layer is performed at normal incidence to the substrate of the reactive ion plasma, said plasma exhibiting a maximum rate of sputtering at an angle of incidence between 40° and 60° to the normal to the local surface of said substrate and said masking photoresist layer, facets produced by said faceting of said masking photoresist layer being obtained by preferential erosion in the vicinity of the radius of curvature of said top edges of said photoresist layer and thus exhibiting an inclination of between 40° and 60° in relation to the angle of incidence of said reactive ion plasma, corresponding to the maximum rate of sputtering.

7. Method according to claim 1, said nonisotropic eroding comprising reactive ion etching in an etching medium consisting of a chlorine compound diluted in a neutral gas such as nitrogen or argon at a pressure lower than 200 mtorr in the absence of deposition of chloro- or fluorocarbon compounds.

* * * * *